(12) United States Patent
Lee

(10) Patent No.: US 8,999,745 B2
(45) Date of Patent: Apr. 7, 2015

(54) PHASE-CHANGE MEMORY DEVICE AND FABRICATION METHOD THEREOF

(71) Applicant: SK Hynix Inc., Gyeonggi-do (KR)

(72) Inventor: Il Yong Lee, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 138 days.

(21) Appl. No.: 13/845,825

(22) Filed: Mar. 18, 2013

(65) Prior Publication Data

US 2014/0166964 A1 Jun. 19, 2014

(30) Foreign Application Priority Data

Dec. 17, 2012 (KR) .................. 10-2012-0147439

(51) Int. Cl.
*H01L 21/20* (2006.01)
*H01L 27/24* (2006.01)
*H01L 45/00* (2006.01)

(52) U.S. Cl.
CPC ............ *H01L 27/2409* (2013.01); *H01L 45/06* (2013.01); *H01L 45/126* (2013.01); *H01L 45/1293* (2013.01); *H01L 45/141* (2013.01); *H01L 45/1675* (2013.01)

(58) Field of Classification Search
USPC .............. 438/382, 95; 257/E31.029, E45.002
See application file for complete search history.

(56) References Cited

FOREIGN PATENT DOCUMENTS

| KR | 1020100052315 | 5/2010 |
| KR | 1020110068581 | 6/2011 |

OTHER PUBLICATIONS

Y. Sasago et al., "Cross point phase change memory with 4F2 cell size driven by low contact resistivity Poly-Si Diode," 2 pages.

*Primary Examiner* — Amar Movva
(74) *Attorney, Agent, or Firm* — IP & T Group LLP

(57) ABSTRACT

A phase-change memory device and a method of fabricating the same are provided. The phase-change memory device includes a semiconductor substrate in which a word line is arranged, a diode line disposed over the word line and extending parallel to the word line, a phase-change line pattern disposed over the diode line, and a projection disposed between the diode line and the phase-change line pattern and protruding from the diode line. The diode line and the projection are formed of a single layer to be in continuity with each other.

5 Claims, 6 Drawing Sheets

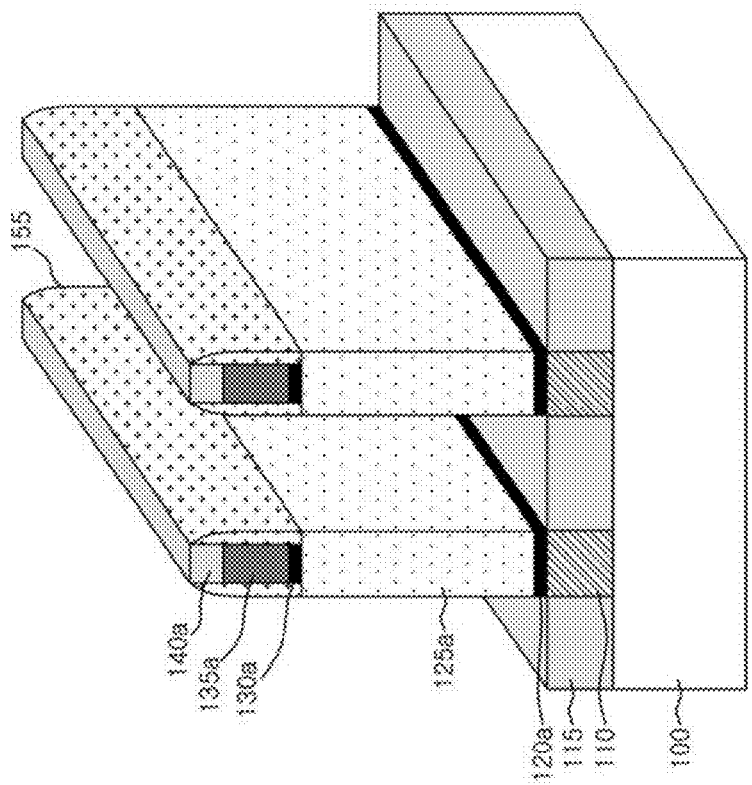
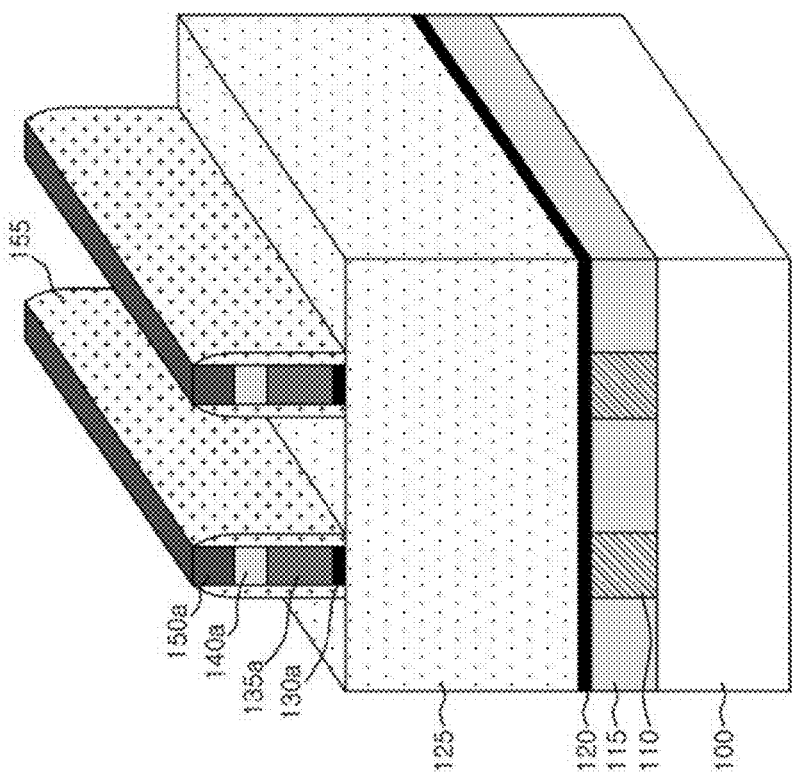

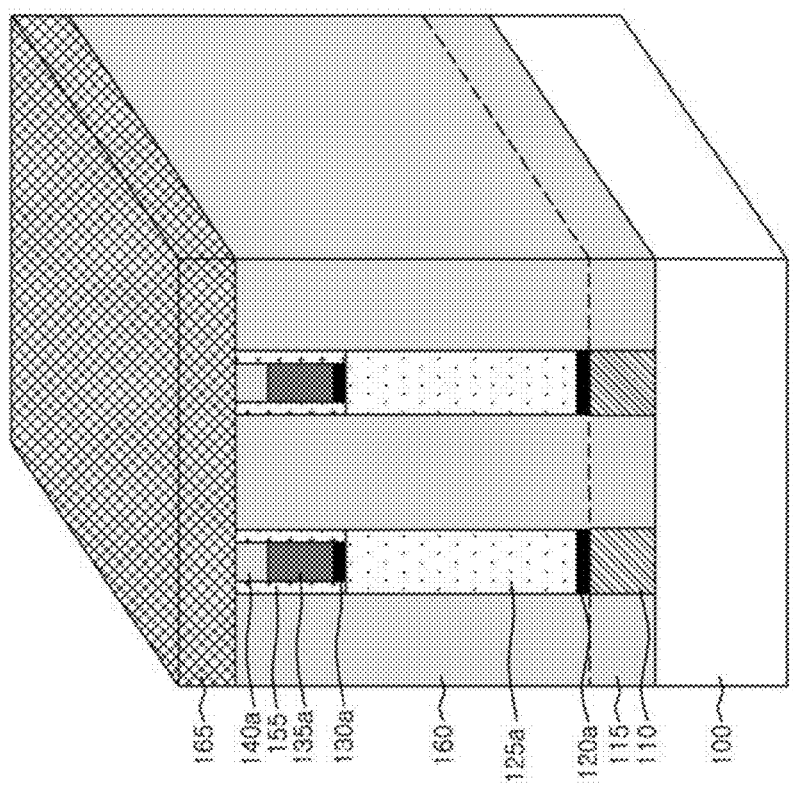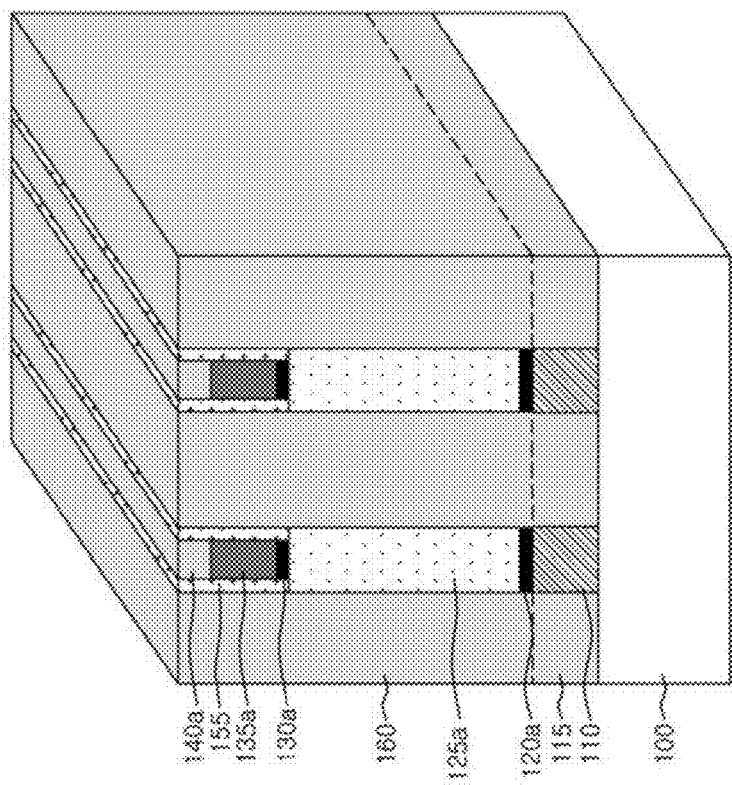

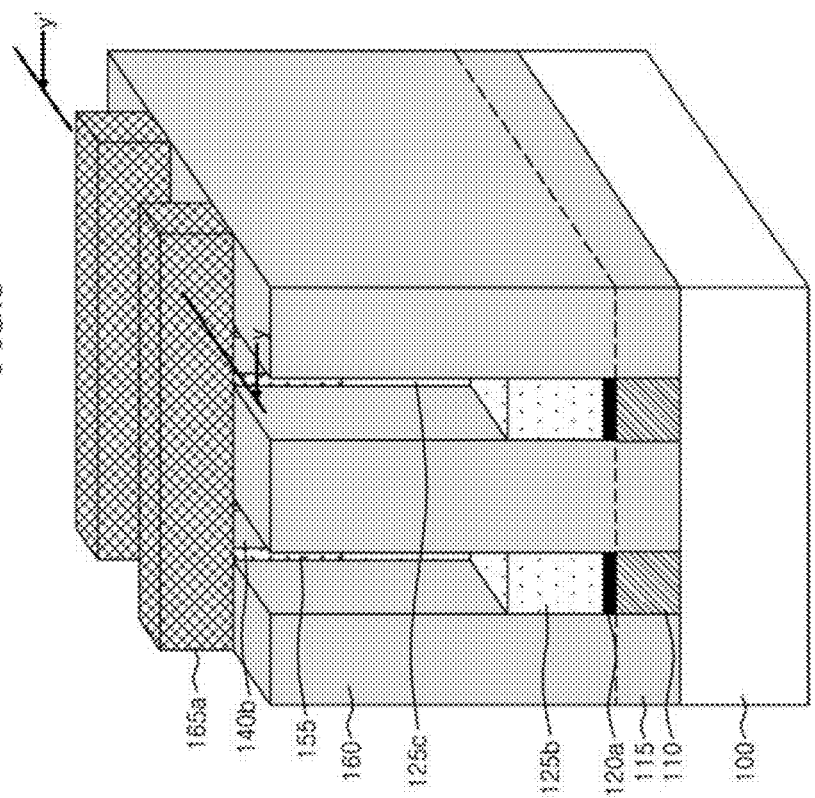
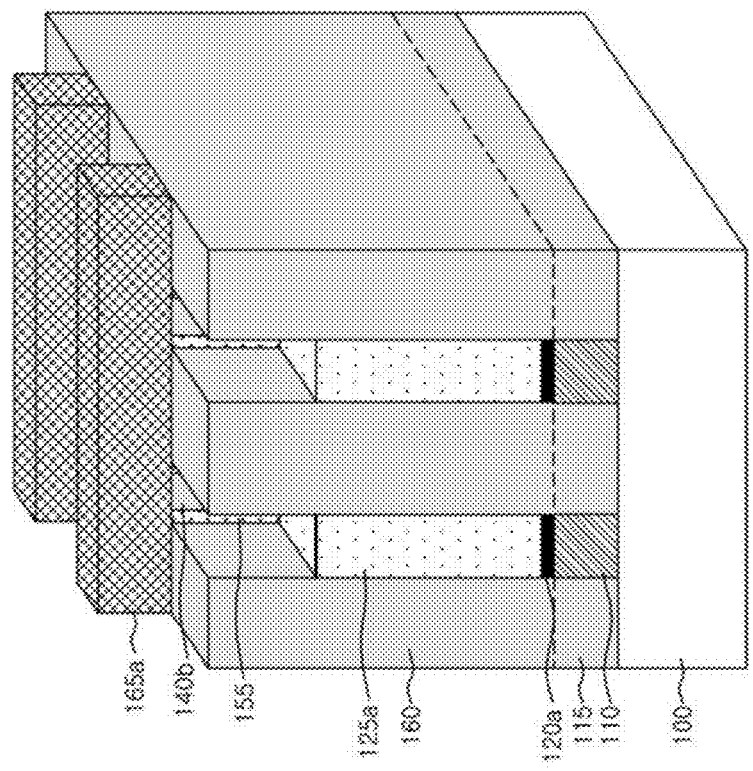

PHASE-CHANGE MEMORY DEVICE AND FABRICATION METHOD THEREOF

CROSS-REFERENCES TO RELATED APPLICATION

The present application claims priority under 35 U.S.C. 119(a) to Korean application number 10-2012-0147439, filed on Dec. 17, 2012, in the Korean Intellectual Property Office, which is incorporated herein by reference in its entirety.

BACKGROUND

1. Technical Field

The inventive concept relates to a resistance memory device, and more particularly, to a phase-change memory device and a method of fabricating the same.

2. Related Art

A phase-change memory devices that is one of nonvolatile memory devices includes a phase-change material of which resistance is changed depending on temperature. As the phase-change material, there is typically a chalcogenide material including germanium (Ge), antimony (Sb), and/or tellurium (Te). The phase-change material is changed into an amorphous state or a crystalline state depending on temperature to define a reset state (or logic "1") or a set state (or logic "0").

A memory cell of the phase-change material layer may include a variable resistor configured of a phase-change material and a switching device configured to selectively drive the variable resistor that are connected between a word line and a bit line.

As the switching device of the phase-change memory device, a diode occupying a small area has been mainly used.

An early diode is formed by doping impurities into a polysilicon layer patterned using a general photolithography process.

However, it is a trend to require a diode and a heating electrode having a critical dimension (CD) equal to or less than resolution of exposure equipment. In order to meet these demands, the diode and the heating electrode having the CD equal to or less than the resolution of the equipment are formed by forming a hard mask layer for confining a diode and a heating electrode region using double spacer patterning technology (SPT) and patterning a lower layer using the hard mask layer.

However, when a heating electrode layer and a diode layer are etched using the hard mask, since a thickness of a film to be etched is very large, leaning occurs and thus the phase-change memory becomes in an unstable state.

In particular, as illustrated in FIG. 1, a phase-change material layer 10 has a positive slope due to the leaning and thus a location in which phase-change is generated in the phase-change material layer 10 is biased downward. In FIG. 1, "A" indicates a location in which phase-change is normally generated when the leaning is not generated, and "B" indicates a location in which the phase-change is generated when the leaning is generated. When the phase-change generation location is changed, heat loss is generated to a side of a barrier layer 15 below the phase-change material layer 10.

When the phase-change memory device is fabricated, a double SPT process may be performed, and the heating electrode layer and the diode layer may be simultaneously etched using a mask material obtained the double SPT process. Thus, etching failure may occur and long fabrication processing time may be required.

SUMMARY

According to one aspect of an exemplary embodiment of the present invention, there is provided a phase-change memory device. The phase-change memory device may include a semiconductor substrate in which a word line is arranged, a diode line disposed over the word line and extending parallel to the word line, a phase-change line pattern disposed over the diode line, and a projection disposed between the diode line and the phase-change pattern and protruding from the diode line. The diode line and the projection are formed of a single layer to be in continuity with each other.

According to another aspect of an exemplary embodiment of the present invention, there is provided a phase-change memory device. The phase-change memory device may include a word line, a line-shaped diode disposed over the word line, a pattern-shaped heating electrode formed of the same material as the line-shaped diode, and a phase-change line pattern disposed over the heating electrode to correspond to the heating electrode.

According to still another aspect of an exemplary embodiment of the present invention, there is provided a method of fabricating a phase-change memory device. The method may include forming a word line over a semiconductor substrate, forming a diode layer over the word line, forming a phase-change layer over the diode layer, patterning the phase-change layer by etching, thereby forming a phase-change line in a line shape extending to a first direction, patterning the diode layer by etching, thereby forming a diode line in the same shape as the phase-change line, filling an insulating layer between the line-shaped phase-change layer and the diode layer, depositing a conductive layer over the insulating layer and the phase-change line, patterning the conductive layer and the phase-change line by etching, thereby respectively forming a bit line and a phase-change line pattern in a line shape extending to a second direction perpendicular to the first direction, and etching the exposed diode layer using a bit line as a mask, thereby forming a line-shaped heating electrode and simultaneously confining a line-shaped diode.

These and other features, aspects, and embodiments are described below in the section entitled "DETAILED DESCRIPTION".

BRIEF DESCRIPTION OF THE DRAWINGS

The above and other aspects, features and other advantages of the subject matter of the present disclosure will be more clearly understood from the following detailed description taken in conjunction with the accompanying drawings, in which:

FIGS. 2 to 9 are perspective views sequentially illustrating a process of fabricating a phase-change memory device according to an exemplary embodiment of the inventive concept;

DETAILED DESCRIPTION

Figure 1:
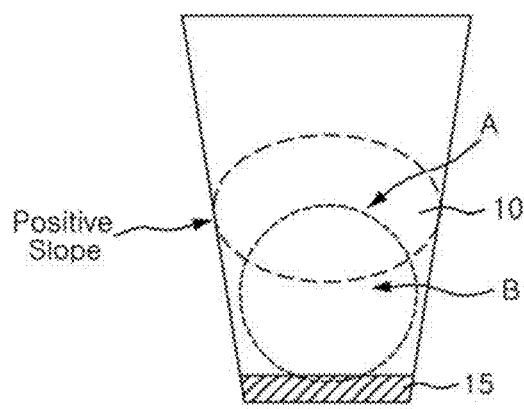
FIG. 1 is a cross-sectional view illustrating a phase-change location in a phase-change material layer of a general phase-change memory device.

Hereinafter, exemplary embodiments will be described in greater detail with reference to the accompanying drawings.

Exemplary embodiments are described herein with reference to cross-sectional illustrations that are schematic illustrations of exemplary embodiments (and intermediate structures). As such, variations from the shapes of the illustrations as a result, for example, of manufacturing techniques and/or tolerances, are to be expected. Thus, exemplary embodiments should not be construed as limited to the particular shapes of regions illustrated herein but may be to include deviations in shapes that result, for example, from manufacturing. In the drawings, lengths and sizes of layers and regions may be exaggerated for clarity. Like reference numerals in the drawings denote like elements. It is also understood that when a layer is referred to as being "on" another layer or substrate, it can be directly on the other or substrate, or intervening layers may also be present.

Figure 2:
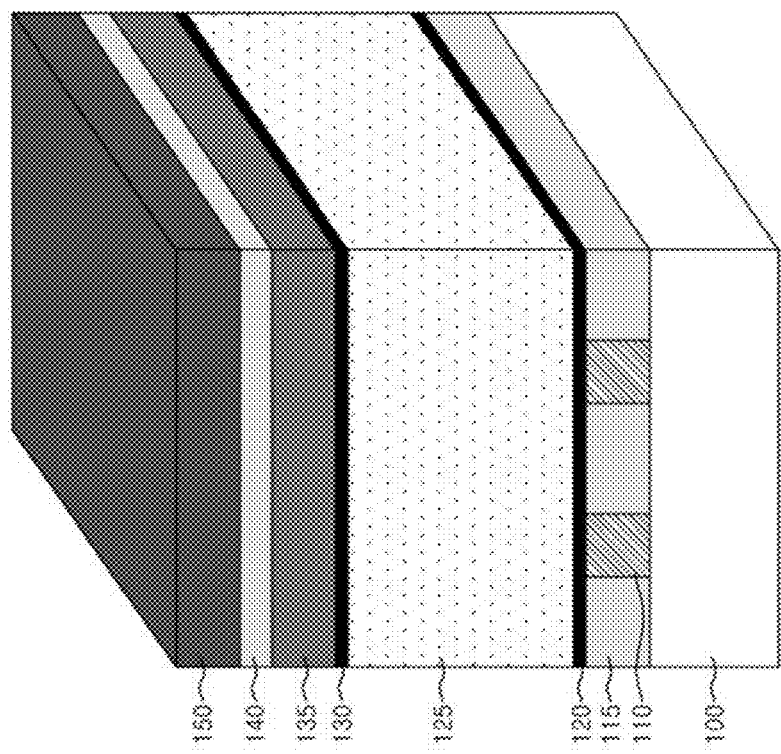

Referring to FIG. 2, a word line 110 extending to a first direction is formed on the semiconductor substrate 100 through a conventional method. An insulating layer 115 is formed in a space between word lines 110 to insulate adjacent word lines 110 from each other. A semiconductor layer 125 is formed on the semiconductor substrate including the word line 110. The semiconductor layer 125 may include a polysilicon layer, an amorphous layer, or a crystalline silicon layer. The semiconductor layer 125 may be an intrinsic semiconductor layer or a semiconductor layer doped with first conductivity type impurities, for example, n-type impurities. Subsequently, impurities are implanted into the exposed semiconductor layer 125 to perform a diode operation.

When the semiconductor layer 125 is an intrinsic layer, for example, n-type impurities are ion-implanted into a lower region of the semiconductor layer 125 as a target, and p-type impurities are ion-implanted into an upper region of the semiconductor layer 125 as a target. When the semiconductor layer 125 is an n-doped layer, p-type impurities are ion-implanted into the upper region of the semiconductor layer 125 as a target.

Therefore, the semiconductor layer 125 is divided into a high concentration p-type impurity region, a low concentration p-type impurity region, a low concentration n-type impurity region, and a high concentration n-type impurity region from a top thereof to a bottom thereof.

A barrier layer 120 may be interposed between the semiconductor layer 125 and the word line 110 and a barrier layer 130 may be also formed on the semiconductor layer 125. In the exemplary embodiment, for clarity, the barrier layer 120 disposed below the semiconductor layer 125 may be referred to as a lower barrier layer 120 and the barrier layer 130 disposed on the semiconductor layer 125 may be referred to as an upper barrier layer 130. Each of the upper and lower barrier layers 130 and 120 may include titanium/titanium nitride (Ti/TiN), but the upper and lower barrier layers 130 and 120 are not limited thereto. Various materials serving as a conductive barrier may be used as the upper and lower barrier layers 130 and 120. A phase-change material layer 135, a connection layer 140, and a hard mask layer 150 are sequentially formed on the upper barrier layer 130. The phase-change material layer 135 may include a chalcogenide material containing Ge, Sb, and/or Te. The connection layer 140 may include the same material as an upper electrode to be formed in a subsequent process.

Figure 3:
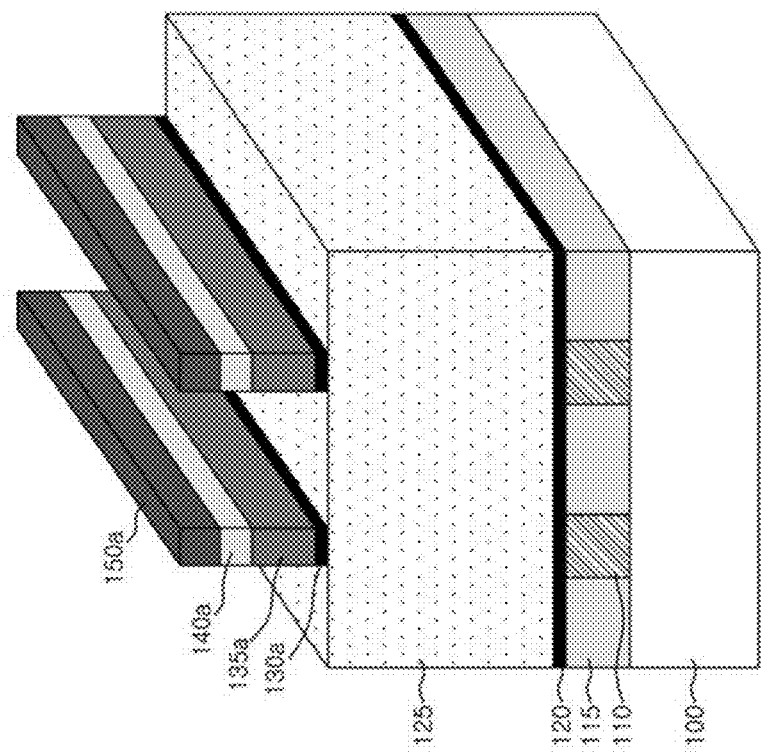

Referring to FIG. 3, a mask pattern (not shown) is formed on a hard mask layer 150 through a SPT method, and the hard mask layer 150 is etched in the same shape as the mask pattern to form a hard mask layer pattern 150a.

Figure 11:
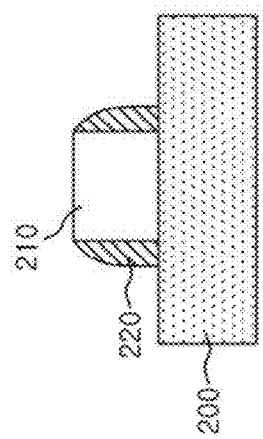
FIGS. 11 and 12 are views explaining a SPT method according to an exemplary embodiment of the inventive concept.
Figure 12:
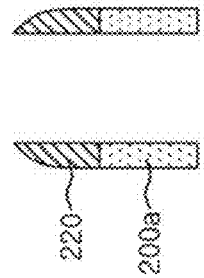

As illustrated in FIG. 11, in the SPT method, a sacrificial pattern 210 is formed on the layer 200 to be etched, and spacers 220 are formed on both sides of the sacrificial pattern 210 through a conventional spacer forming method. As illustrated in FIG. 12, the sacrificial pattern 210 is removed, and the etched pattern 200a is formed using the remaining spacers 210 as a mask. Therefore, the hard mask layer pattern 150a in the exemplary embodiment may correspond to the etched pattern 200a of FIG. 12.

Referring back to FIG. 3, the connection layer 140, the phase-change material layer 135, and the upper barrier layer 130 below the hard mask layer pattern 150a are sequentially patterned using the hard mask layer pattern 150a obtained the above-described SPT method. A structure including the connection layer pattern 140a, phase-change material layer pattern 135a, and upper barrier layer pattern 130a has a line pattern shape extending to the first direction (for example, a direction parallel to the word line). The structure having the line pattern shape (hereinafter, referred to as a phase-change line) may be disposed to correspond to the word line 110 therebelow parallel to the word line.

Referring to FIG. 4, heat-resistance spacers 155 are formed on the sidewalls of the phase-change line extending to the first direction through a conventional method. The heat-resistance spacers 155 may be provided to protect the phase-change material layer pattern 135a. The heat-resistance spacers 155 are formed on the sidewalls of the phase-change material layer pattern 135a to prevent heat from moving to adjacent cells in phase-change. The heat-resistance spacers 155 may include a silicon nitride layer.

Referring to FIG. 5, the underlying semiconductor layer 125 and the lower barrier layer 120 are patterned using the heat-resistance spacers 155 and the hard mask layer pattern 150a as a mask to form a diode line 125a and a lower barrier layer pattern 120a. The diode line 125a is disposed on the word line 110, and the hard mask layer pattern 150a may be removed in the patterning process to expose the connection layer pattern 140a.

As illustrated in FIG. 6, an interlayer insulating layer 160 is buried between diode lines 125a and the phase-change lines. A surface planarization is performed on the buried interlayer insulating layer 160.

Referring to FIG. 7, an upper metal layer 165 is formed on the semiconductor substrate including the planarized interlayer insulating layer 160. The upper metal layer 165 is electrically connected to the exposed connection layer pattern 140a.

Referring to FIG. 8, a mask pattern (not shown) is formed on the upper metal layer 165 using the SPT method illustrated in FIGS. 11 and 12, and the upper metal layer 165 is patterned in the same shape as the mask pattern to define the bit line 165a. The phase-change line exposed by the bit line 165a is removed to define a phase-change line pattern. The phase-change line pattern includes a second connection layer pattern 140b, a second phase-change material layer pattern 135b, and a second upper barrier layer pattern 130b (see FIG. 10). Phase-change line patterns are separated between cells.

As illustrated in FIG. 9, the semiconductor layer 125a exposed by the bit line 165a is partially etched. The partial etching process is a process that etches a partial thickness of a total thickness of a film. In the exemplary embodiment, only a portion of the exposed semiconductor layer 125a corresponding to the high concentration p-type impurity region is etched to form a semiconductor layer 125c.

Figure 10:
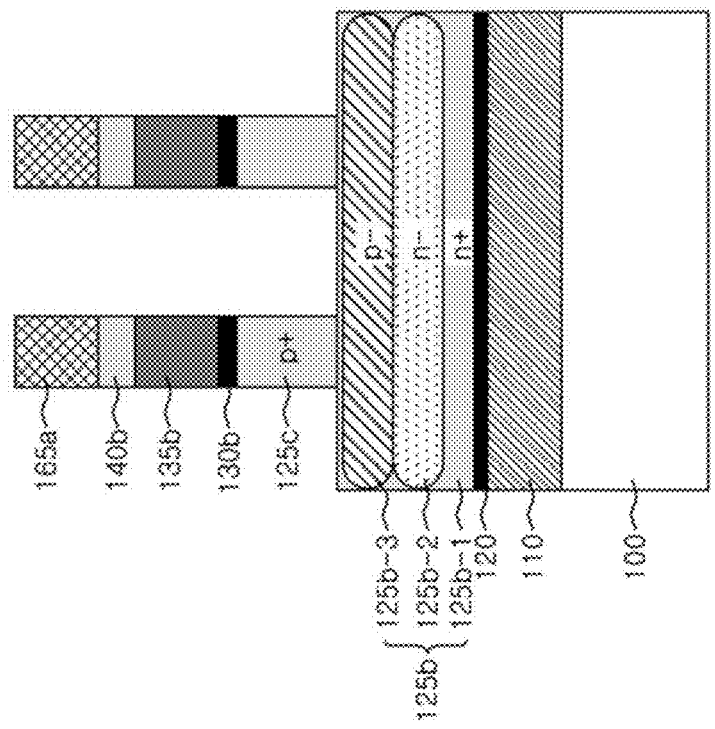
FIG. 10 is a cross-sectional view illustrating the phase-change memory device taken along line y-y' shown in FIG. 9.

FIG. 10 is a cross-sectional view illustrating the phase-change memory device taken along line y-y' of FIG. 9. As illustrated in FIG. 10, the semiconductor layer 125c (hereinafter, referred to as a high concentration p-type layer) corresponding to the patterned high concentration p-type impurity region serves as a heating electrode in the phase-change memory device, a low concentration p-type impurity region 125b-3, a low concentration n-type impurity region 125b-2, and a high concentration n-type impurity region 125b-1 together serve as a line-shaped diode 125b.

Specifically, as illustrated in FIG. 10, since the high concentration p-type layer 125c corresponds to a substantial conductive layer, the node separation between cells is done through the partial patterning of the high concentration p-type impurity region. In particular, since a semiconductor layer such as a polysilicon layer has superior heating characteristics, the polysilicon layer may be used as a heating electrode of the phase-change memory device.

On the other hand, even when the low concentration p-type impurity region 125b-3 and the n-type impurity regions 125b-2 and 125b-1 are not patterned, but remain in a line shape, there is no electrical issue. As known, in the PN junction, current flows from a p-type impurity region to an n-type impurity region when a threshold voltage or more is applied, while current does not flow from the n-type impurity region to the p-type impurity region unless a breakdown voltage or more is applied. Therefore, even when a specific cell operates, a diode operation does not occur in other cells adjacent to the specific cell and disturbance is not caused. Further, since the line-shaped low concentration p-type impurity region, low concentration n-type impurity region, and high concentration n-type impurity region extend parallel to the word line, an electric issue is not caused even when a corresponding word line is selected.

Therefore, in the exemplary embodiment, since the phase-change material layer and the heating electrode layer (high concentration p-type impurity region) are separately etched in different steps, the pattern leaning and positive slope occurring in etching of a thick film are not caused and a phase-change error may be reduced.

Further, as in the related art, since the phase-change layer, heating electrode, and diode layer are not collectively etched, a processing time may be considerably reduced.

The above embodiment of the present invention is illustrative and not limitative. Various alternatives and equivalents are possible. The invention is not limited by the embodiment described herein. Nor is the invention limited to any specific type of semiconductor device. Other additions, subtractions, or modifications are obvious in view of the present disclosure and are intended to fall within the scope of the appended claims.

What is claimed is:

1. A method of fabricating a phase-change memory device, the method comprising:
   forming a word line over a semiconductor substrate;
   forming a diode layer over the word line;
   forming a phase-change layer over the diode layer;
   patterning the phase-change layer by etching, thereby forming a phase-change line in a line shape extending to a first direction;
   patterning the diode layer by etching, thereby forming a diode line in the same shape as the phase-change line;
   filling an insulating layer in a space formed through the patterning of the phase-change layer and the diode layer;
   depositing a conductive layer over the insulating layer and the phase-change line;
   patterning the conductive layer and the phase-change line by etching, thereby respectively forming a bit line and a phase-change line pattern in a line shape extending to a second direction perpendicular to the first direction; and
   etching the exposed diode layer using a bit line as a mask, thereby forming a line-shaped heating electrode and simultaneously confining a line-shaped diode.

2. The method of claim 1, wherein the patterning the phase-change layer by etching includes:
   forming a sacrificial pattern over the phase-change layer;
   forming spacers for a mask on both sides of the sacrificial pattern;
   removing the sacrificial pattern; and
   patterning the phase-change layer using the spacers for a mask.

3. The method of claim 1, wherein the patterning the conductive layer and the phase-change line by etching includes:
   forming a sacrificial pattern over the conductive layer;
   forming spacers for a mask on both sides of the sacrificial pattern;
   removing the sacrificial pattern; and
   patterning the conductive layer and the phase-change line using the spacers for a mask.

4. The method of claim 1, further comprising implanting impurities into the diode layer so that the diode layer has a distribution of a high concentration n-type impurity region, a low concentration n-type impurity region, a low concentration p-type impurity region, and a high concentration p-type impurity region from a bottom thereof, between the forming a diode layer and the forming a phase-change layer.

5. The method of claim 4, wherein the etching the exposed diode layer using a bit line as a mask includes:
   etching only the high concentration p-type impurity region of the diode layer so that the patterned high concentration p-type impurity region becomes the line-shaped heating electrode.

* * * * *